United States Patent
Lee

(10) Patent No.: US 9,997,248 B2
(45) Date of Patent: Jun. 12, 2018

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Jung Hwan Lee, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/628,755

(22) Filed: Jun. 21, 2017

(65) Prior Publication Data

US 2018/0137919 A1    May 17, 2018

(30) Foreign Application Priority Data

Nov. 15, 2016  (KR) .......................... 10-2016-0152130

(51) Int. Cl.
| | |
|---|---|
| *G11C 16/06* | (2006.01) |
| *G11C 16/16* | (2006.01) |
| *H01L 27/115* | (2017.01) |
| *G11C 16/34* | (2006.01) |
| *G11C 11/56* | (2006.01) |
| *G11C 16/28* | (2006.01) |

(52) U.S. Cl.
CPC .......... *G11C 16/16* (2013.01); *G11C 11/5621* (2013.01); *G11C 16/28* (2013.01); *G11C 16/344* (2013.01); *H01L 27/115* (2013.01)

(58) Field of Classification Search
CPC .......... G11C 16/0483; G11C 11/5621; G11C 11/5628; G11C 16/16; G11C 16/349; G11C 16/3495; G11C 29/52; G11C 16/28

USPC .......... 365/185.17, 185.18, 185.19, 185.11, 365/185.12, 185.23, 185.24
See application file for complete search history.

(56) References Cited

U.S. PATENT DOCUMENTS

| | | | |
|---|---|---|---|
| 2007/0159886 A1* | 7/2007 | Kang .................. | G11C 11/5621 365/185.17 |
| 2012/0155184 A1* | 6/2012 | Kang .................. | G11C 11/5621 365/185.19 |
| 2017/0062065 A1* | 3/2017 | Shim ..................... | G11C 29/52 |

FOREIGN PATENT DOCUMENTS

| | | |
|---|---|---|
| KR | 1020090017237 A | 2/2009 |
| KR | 1020090080321 A | 7/2009 |

* cited by examiner

*Primary Examiner* — Gene Auduong
(74) *Attorney, Agent, or Firm* — William Park & Associates LTD.

(57) ABSTRACT

Provided herein may be a semiconductor memory device and a method of operating the same. The semiconductor memory device may include a memory cell array including a plurality of memory blocks, each including dummy cells coupled to dummy word lines and normal memory cells coupled to normal word lines, and a peripheral circuit configured to perform an erase operation on a memory block selected from among the plurality of memory blocks. The semiconductor memory device may include control logic configured to control the peripheral circuit so that a pre-program voltage pulse is applied both to the dummy word lines and to the normal word lines, and dummy word line voltages to be applied to the dummy word lines may be respectively controlled while an erase voltage is applied to a common source line of the selected memory block.

20 Claims, 14 Drawing Sheets

THRESHOLD VOLTAGE DISTRIBUTION OF DUMMY CELLS
AFTER SOFT PROGRAM OPERATION

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2016-0152130 filed on Nov. 15, 2016 in the Korean Intellectual Property Office, the entire disclosure of which is incorporated herein by reference.

BACKGROUND

1. Technical Field

Various embodiments of the present disclosure may generally relate to an electronic device, and more particularly, to a semiconductor memory device and a method of operating the semiconductor memory device.

2. Related Art

Semiconductor memory devices are memory devices realized using a semiconductor such as silicon (Si), germanium (Ge), gallium arsenide (GaAs), or indium phosphide (InP). Semiconductor memory devices are classified into a volatile memory device and a nonvolatile memory device.

The volatile memory device is a memory device in which data stored therein is lost when power is turned off. Representative examples of the volatile memory device include a static RAM (SRAM), a dynamic RAM (DRAM), a synchronous DRAM (SDRAM), etc. The nonvolatile memory device is a memory device in which data stored therein is maintained even when power is turned off. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

An embodiment of the present disclosure may provide for a semiconductor memory device. The semiconductor memory device may include a memory cell array including a plurality of memory blocks, each including dummy cells coupled to dummy word lines and normal memory cells coupled to normal word lines, a peripheral circuit configured to perform an erase operation on a memory block selected from among the plurality of memory blocks, and control logic configured to control the peripheral circuit so that, during the erase operation, a pre-program voltage pulse is applied to the dummy word lines, and dummy word line voltages to be applied to the dummy word lines are respectively controlled while an erase voltage may be applied to a common source line of the selected memory block.

The present disclosure may provide for a method of operating a semiconductor memory device. The semiconductor memory device may include a plurality of memory blocks, each including dummy cells coupled to dummy word lines and normal memory cells coupled to normal word lines. The method may include applying a pre-program voltage pulse to dummy word lines that may be coupled to a memory block selected from among the plurality of memory blocks, and respectively controlling dummy word line voltages to be applied to the dummy word lines while an erase voltage is applied to a common source line of the selected memory block.

DETAILED DESCRIPTION

Figure 1:
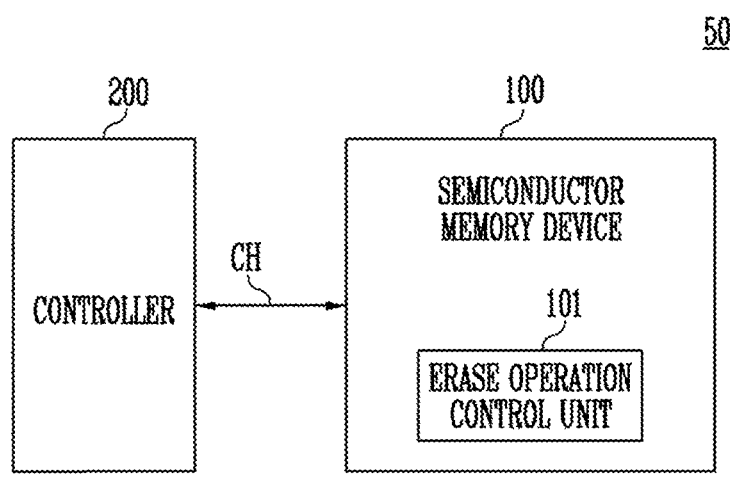
FIG. 1 is a block diagram for explaining a memory system including a semiconductor memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, the present disclosure will be described by describing examples of embodiments of the present disclosure with reference to the attached drawings. Below, embodiments of the present disclosure will be described with reference to the attached drawings.

Various embodiments of the present disclosure may be directed to a semiconductor memory device which has improved reliability, and a method of operating the semiconductor memory device.

FIG. 1 is a block diagram illustrating the configuration of a memory system including a semiconductor memory device according to an embodiment of the present disclosure.

Referring to FIG. 1, a memory system 50 may include a semiconductor memory device 100 and a controller 200.

The semiconductor memory device 100 may take many alternative forms, such as a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In addition, the semiconductor memory device 100 according to the present disclosure may be implemented as a three-dimensional array structure. The present disclosure may also be applied not only to a flash memory in which a charge storage layer is implemented as a conductive floating gate (FG), but also to a charge trap flash (CTF) memory in which a charge storage layer is implemented as an insulating layer.

The semiconductor memory device 100 is operated under the control of the controller 200. The semiconductor memory device 100 includes a memory cell array having a plurality of memory blocks. In an embodiment, the semiconductor memory device 100 may be a flash memory device.

The semiconductor memory device 100 is configured to receive a command and an address from the controller 200 through a channel CH and to access an area selected by the address from the memory cell array. That is, the semiconductor memory device 100 performs an internal operation corresponding to the command on the area selected by the address.

For example, the semiconductor memory device 100 may perform a program operation, a read operation, and an erase operation. During a program operation, the semiconductor memory device 10 may program data in the area selected by the address. During a read operation, the semiconductor memory device 100 may read data from the area selected by the address. During an erase operation, the semiconductor memory device 100 may erase data stored in the area selected by the address.

The controller 200 may control the semiconductor memory device 100 so that a program operation, a read operation or an erase operation is performed. During a program operation, the controller 200 may provide a program command, an address, and data to the semiconductor memory device 100 through the channel CH. During a read operation, the controller 200 may provide a read command and an address to the semiconductor memory device 100 through the channel CH. During an erase operation, the controller 200 may provide an erase command and an address to the semiconductor memory device 100 through the channel CH.

The semiconductor memory device 100 may include an erase operation control unit 101.

The semiconductor memory device 100 may erase data stored in the memory cells included in the semiconductor memory device 100 depending on the operation of the erase operation control unit 101. An erase operation of erasing the data stored in the memory cells may be performed on a memory block basis.

For example, during the erase operation, the semiconductor memory device 100 may receive the erase command and the address of a memory block, from which data is to be erased, from the controller 200. The semiconductor memory device 100 may select the memory block corresponding to the received address and may perform an erase operation for erasing data from the selected memory block.

The erase operation control unit 101 may control the levels of voltages to be applied to the memory cells of the semiconductor memory device 100, times at which the voltages are applied, etc. while the erase operation is performed. For example, information about the levels of the voltages to be applied to the memory cells, the times at which the voltages are applied, etc. while the erase operation is performed may be stored in advance in the semiconductor memory device 100. The erase operation control unit 101 may control the semiconductor memory device 100 so that the erase operation is performed depending on the preset levels of the voltages to be applied to the memory cells or the voltage application times.

An erase method according to an embodiment of the present disclosure will be described with reference to FIGS. 6 to 14, which will be described later.

Although not illustrated in the drawings, the controller 200 may include components, such as a Random Access Memory (RAM), a processing unit, a host interface, and a memory interface, in an embodiment.

The RAM is used as at least one of a work memory of the processing unit, a cache memory between the semiconductor memory device 100 and the host, and a buffer memory between the semiconductor memory device 100 and the host.

The processing unit controls the overall operation of the controller 200. The processing unit is configured to control a read operation, a program operation, an erase operation, and a background operation of the semiconductor memory device 100. The processing unit is configured to run firmware for controlling the semiconductor memory device 100. In an embodiment, the processing unit may perform a function of a flash translation layer (FTL). The processing unit may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The processing unit is configured to randomize data received from the host. For example, the processing unit may randomize the data received from the host using a randomizing seed. The randomized data is provided, as data to be stored, to the semiconductor memory device and is then programmed in the memory cell array.

The processing unit is configured to derandomize the data received from the semiconductor memory device 100 during a read operation. For example, the processing unit may derandomize the data received from the semiconductor memory device 100 using a derandomizing seed. The derandomized data may be outputted to the host. In an embodiment, the processing unit may perform randomizing and derandomizing operations by running software or firmware.

The host interface may include a protocol for performing data exchange between the host and the controller 200. In an embodiment, the controller 200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface interfaces with the semiconductor memory device 100. For example, the memory interface includes a NAND interface or a NOR interface.

Figure 2:
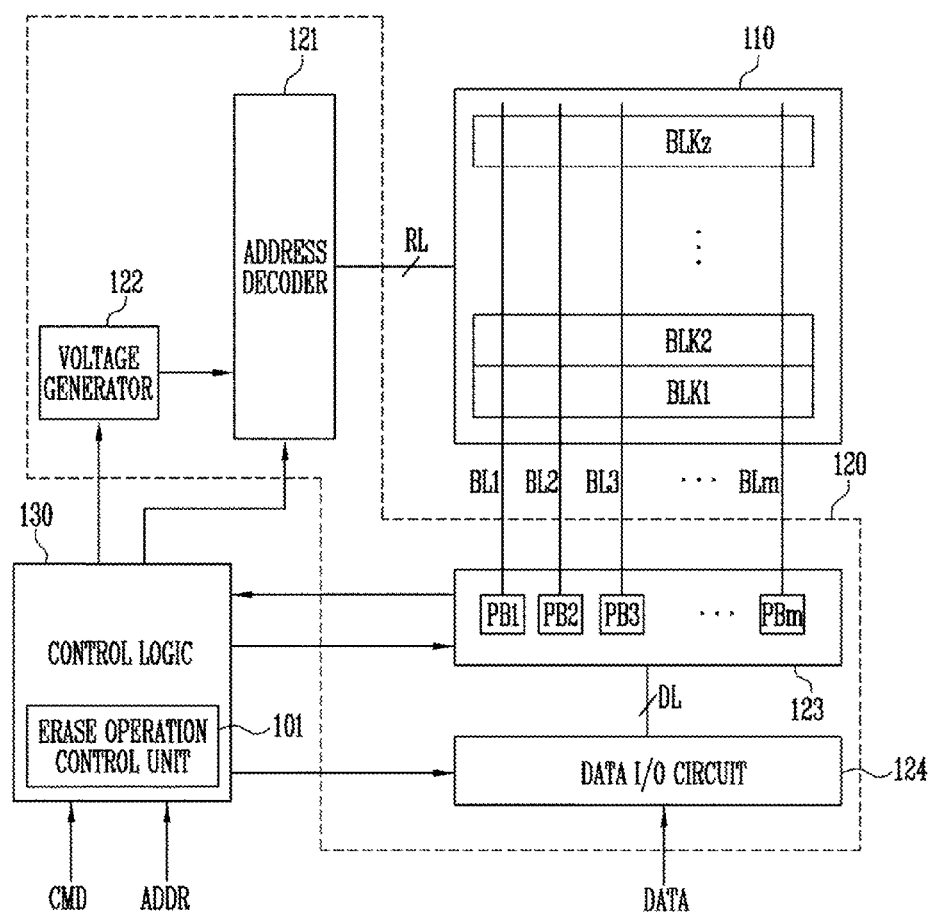
FIG. 2 is a block diagram illustrating the configuration of the semiconductor memory device of FIG. 1.

FIG. 2 is a block diagram illustrating the configuration of the semiconductor memory device 100 of FIG. 1.

Referring to FIG. 2, the semiconductor memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In an embodiment, each of the plurality of memory blocks BLK1 to BLKz included in the memory cell array 110 may include a plurality of dummy cells. As the dummy cells, one or more dummy cells may be connected in series between a drain select transistor and the memory cells and between a source select transistor and the memory cells.

The memory cells of the semiconductor memory device 100 may be each implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read and write circuit 123, and a data input/output (I/O) circuit 124.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to be operated under the control of the control logic 130. The address decoder 121 receives an address ADDR from the control logic 130.

The address decoder 121 is configured to decode a block address of the received address ADDR. The address decoder 121 selects at least one memory block from among the memory blocks BLK1 to BLKz in response to the decoded block address. The address decoder 121 is configured to decode a row address of the received address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verification voltage to a selected word line and apply a verification pass voltage higher than the verification voltage to unselected word lines.

During a read operation, the address decoder 121 may apply a read voltage to a selected word line and apply a pass voltage higher than the read voltage to unselected word lines.

In an embodiment, an erase operation of the semiconductor memory device 100 is performed on a memory block basis. During an erase operation, the address ADDR inputted to the semiconductor memory device 100 includes a block address. The address decoder 121 may decode the block address and select a single memory block in response to the decoded block address. During an erase operation, the address decoder 121 may apply a ground voltage to word lines coupled to the selected memory block.

In an embodiment, the address decoder 121 may be configured to decode a column address of the received address ADDR. A decoded column address DCA may be transferred to the read and write circuit 123. In an exemplary embodiment, the address decoder 121 may include components such as a row decoder, a column decoder, and an address buffer.

The voltage generator 122 is configured to generate a plurality of voltages using an external supply voltage provided to the semiconductor memory device 100. The voltage generator 122 is operated under the control of the control logic 130.

In an embodiment, the voltage generator 122 may generate an internal supply voltage by regulating the external supply voltage. The internal supply voltage generated by the voltage generator 122 is used as an operating voltage of the semiconductor memory device 100.

In an embodiment, the voltage generator 122 may generate a plurality of voltages using an external supply voltage or an internal supply voltage. The voltage generator 122 may be configured to generate various voltages required by the semiconductor memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage and may generate a plurality of voltages by selectively activating the pumping capacitors under the control of the control logic 130.

The generated voltages may be supplied to the memory cell array 110 by the address decoder 121.

The read and write circuit 123 includes first to m-th pages buffers PB1 to PBm. The first to m-th page buffers PB1 to PBm are coupled to the memory cell array 100 through the first to m-th bit lines BL1 to BLm, respectively. The first to m-th page buffers PB1 to PBm are operated under the control of the control logic 130.

The first to m-th page buffers PB1 to PBm perform data communication with the data I/O circuit 124. During a program operation, the first to m-th page buffers PB1 to PBm receive data to be stored DATA through the data I/O circuit 124 and data lines DL.

During a program operation, the first to m-th page buffers PB1 to PBm may transfer the data DATA, received through the data I/O circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage (e.g. a ground voltage) is applied may have increased threshold voltages. Threshold voltages of memory cells coupled to a bit line to which a program prohibition voltage (e.g. a supply voltage) is applied may be maintained. During a program verify operation, the first to m-th page buffers read page data from the selected memory cells through the bit lines BL1 to BLm.

During a read operation, the read and write circuit 123 reads data DATA from the memory cells in the selected page through the bit lines BL, and outputs the read data DATA to the data I/O circuit 124.

During an erase operation, the read and write circuit 123 may float the bit lines BL. In an embodiment, the read and write circuit 123 may include a column select circuit.

The data I/O circuit 124 is coupled to the first to m-th page buffers PB1 to PBm through the data lines DL. The data I/O circuit 124 is operated under the control of the control logic 130.

The data input/output (I/O) circuit 124 may include a plurality of I/O buffers (not illustrated) for receiving inputted data. During a program operation, the data I/O circuit 124 receives data to be stored DATA from an external controller (not illustrated). During a read operation, the data I/O circuit 124 outputs the data, received from the first to m-th page buffers PB1 to PBm included in the read and write circuit 123, to the external controller.

The control logic 130 may be coupled to the address decoder 121, the voltage generator 122, the read and write circuit 123, and the data I/O circuit 124. The control logic 130 may be configured to control the overall operation of the semiconductor memory device 100. The control logic 130 may be operated in response to a command CMD received from an external device.

When the erase operation is performed, the control circuit 130 may erase data from a selected memory block and thereafter execute a soft program for reducing the threshold voltage distribution of normal memory cells included in the memory block or for increasing the threshold voltages of the dummy memory cells.

In accordance with an embodiment of the present disclosure, the control circuit 130 performs a pre-program operation on memory cells included in the selected memory block before performing an erase operation, without executing the soft program, after which data in the selected memory block may be erased. Here, while the erase operation is performed, the control circuit 130 may control the threshold voltages of the dummy cells by applying an erase prohibition voltage to dummy word lines to which a ground voltage is applied after a predetermined period of time has elapsed.

The control circuit 130 may include an erase operation control unit 101. The erase operation control unit 101 may control an erase operation on a memory block selected from among the plurality of memory blocks BLK1 to BLKz included in the memory cell array 110.

The erase operation control unit 101 may control voltages to be applied to row lines or bit lines that are coupled to the selected memory block during an erase operation.

In accordance with an embodiment of the present disclosure, the erase operation control unit 101 performs a pre-program operation. The erase operation control unit 101 may apply a pre-program voltage pulse to word lines coupled to the selected memory block. In an embodiment, the word lines may include normal word lines and dummy word lines.

In an embodiment, the erase operation control unit 101 may perform an erase operation after performing a pre-program operation. The erase operation control unit 101 may control the peripheral circuit 120 so that an erase voltage Verase is applied to a common source line. Here, the erase operation control unit 101 may control the peripheral circuit 120 so that an erase permission voltage (e.g. a ground voltage) is applied to normal word lines and dummy word lines, which are coupled to the selected memory block. While the ground voltage is applied to the word lines, data in the memory cells and the dummy cells may be erased.

That is, the threshold voltages of the memory cells and the dummy cells may be decreased until they reach threshold voltages in an erase state (E).

The erase operation control unit 101 may control a degree at which dummy memory cells are erased while the erase voltage Verase is applied to the common source line. For example, if a preset reference time has elapsed during an interval in which the voltage of the common source line is increased, the erase operation control unit 101 may apply an erase prohibition voltage Verase_pass to the dummy word lines. That is, after a predetermined time has elapsed since the application of the erase permission voltage, when the erase prohibition voltage Verase_pass is applied to the dummy word lines, the threshold voltages of the dummy cells may not be further decreased.

Hereinafter, a description will be made on the assumption that a total of x dummy cells (i.e. first to x-th dummy cells) are included in a single memory block. The program speeds of a plurality of dummy cells may be different from each other. For example, the program speed of dummy cells closer to the common source line may be higher than that of dummy cells far away from the common source line. Alternatively, the program speeds of the dummy cells may be different from each other depending on whether the dummy cells are adjacent to select transistors. Alternatively, in the structure of a memory cell array in which memory cells are stacked in a vertical structure, program speeds may be different from each other depending on the thickness of channels.

In the present specification, a description will be made on the assumption that the program speed of a first dummy cell is higher than that of a second dummy cell, the program speed of the second dummy cell is higher than that of a third dummy cell, and the program speed of an x−1-th dummy cell is higher than that of an x-th dummy cell. In an embodiment, for example, a dummy or normal memory cell having a high program speed consumes less time to program than a dummy memory cell or normal memory cell having a low program speed. For example, a dummy memory cell or normal memory cell with a higher program speed may be faster to program, or take less time to program, than a dummy memory cell or normal memory cell having a lower program speed.

First to x-th dummy word lines are coupled to the gates of the first to x-th dummy cells, respectively. The threshold voltages of the first to x-th dummy cells may be controlled depending on dummy word line voltages which are applied to the first dummy word line to the x-th dummy word line.

In an embodiment, the erase operation control unit 101 may control timings at which the erase prohibition voltage Verase_pass is applied to the dummy word lines so that the timings are different from each other depending on differences between the program speeds of the dummy cells. For example, the erase operation control unit 101 may control respective dummy word line voltages so that the erase prohibition voltage Verase_pass is sequentially applied in the sequence of dummy word lines ranging from a dummy word line, coupled to a dummy cell having a relatively high program speed, to a dummy word line, coupled to a dummy cell having a relatively low program speed, among the plurality of dummy cells included in the selected memory block.

For example, if a first reference time has elapsed since the application of the erase permission voltage (e.g. the ground voltage) to the dummy word lines, the erase operation control unit 101 may apply the erase prohibition voltage Verase_pass to the dummy word line, which is coupled to the first dummy cell having the highest program speed. If a second reference time that is longer than the first reference time has elapsed since the application of the erase permission voltage (ground voltage) to the dummy word lines, the erase operation control unit 101 may apply the erase prohibition voltage Verase_pass to the dummy word line, which is coupled to the second dummy cell having the next highest program speed. If an x-th reference time longer than an x−1-th reference time has elapsed since the application of the erase permission voltage (ground voltage) to the dummy word lines, the erase operation control unit 101 may apply the erase prohibition voltage Verase_pass to the dummy word line, which is coupled to the x-th dummy cell having the lowest program speed.

In order to control the timing at which the erase prohibition voltage Verase_pass is applied depending on the differences between the program speeds of the dummy cells, the erase operation control unit 101 may include a separate register for storing information about the program speeds of respective dummy cells, information about the differences between the program speeds of respective dummy cells, or information about the timings at which the erase prohibition voltage is applied to dummy word lines depending on the differences between the program speeds of respective dummy cells. Alternatively, in an embodiment, the information about the program speeds of respective dummy cells, information about the differences between the program speeds of respective dummy cells, or the information about the timings at which the erase prohibition voltage is applied to dummy word lines depending on the differences between the program speeds of respective dummy cells may be stored in some area of the memory cell array 110 (e.g. a content addressable memory (CAM) area). The erase operation control unit 101 may control the timings at which the erase prohibition voltage Verase_pass is applied to each dummy word line, based on the information about the program speeds of respective dummy cells, the information about the differences between the program speeds of respective dummy cells, or the information about the timings at which the erase prohibition voltage is applied to dummy word lines depending on the differences between the program speeds of respective dummy cells. By means of this timing control, the erase operation control unit 101 may individually control the threshold voltages of the dummy cells.

In accordance with an embodiment of the present disclosure, the erase operation control unit 101 may apply the ground voltage to normal word lines and may apply erase permission voltages having different levels to dummy word lines depending on the program speeds of the dummy cells when the erase voltage Verase is applied to the common source line.

For example, the erase operation control unit 101 may apply an erase permission voltage having a voltage level higher than that of the ground voltage to dummy word line, coupled to a dummy cell having a relatively high program speed, among the plurality of dummy cells included in the selected memory block, and may apply an erase permission voltage having a voltage level lower than that of the ground voltage to a dummy word line, coupled to a dummy cell having a relatively low program speed.

If a preset reference time has elapsed since the application of erase permission voltages having different levels to respective dummy word lines, the erase operation control unit 101 may control the peripheral circuit 120 so that the erase prohibition voltage Verase_pass is applied to the respective dummy word lines.

For example, when the erase voltage Verase is applied to the common source line, the erase operation control unit 101 may apply a first erase permission voltage V1 having a voltage level higher than that of the ground voltage to the first dummy word line coupled to the first dummy cell having the highest program speed, may apply a second erase permission voltage V2 having a voltage level lower than that of the first erase permission voltage V1 to a second dummy word line coupled to the second dummy cell having the next highest program speed, and may apply an x-th erase permission voltage Vx having a voltage level lower than that of an x−1-th erase permission voltage Vx−1 to a dummy word line coupled to the x-th dummy cell having the lowest program speed. Here, the erase operation control unit 101 may apply the ground voltage to the normal word lines to erase data from the memory cells. In an embodiment, the erase permission voltages that are applied to the dummy word lines may have negative voltage levels lower than 0 V.

If the reference time has elapsed since the application of the erase permission voltages to the word lines, the erase operation control unit 101 may apply the erase prohibition voltage Verase_pass to the dummy word lines.

In order to control the levels of the erase permission voltages that are to be applied to respective dummy word lines depending on the differences between the program speeds of the dummy cells, the erase operation control unit 101 may include a separate register for storing information about the program speeds of respective dummy cells, information about the differences between the program speeds of respective dummy cells, or information about the levels of the erase permission voltages to be applied to dummy word lines depending on the differences between the program speeds of respective dummy cells. Alternatively, the information about the program speeds of respective dummy cells, information about the differences between the program speeds of respective dummy cells, or information about the levels of the erase permission voltages to be applied to dummy word lines depending on the differences between the program speeds of respective dummy cells may be stored in some area of the memory cell array 110 (e.g. a CAM area). The erase operation control unit 101 may control the levels of the erase permission voltages to be applied to respective dummy word lines, based on the information about the program speeds of respective dummy cells, the information about the differences between the program speeds of respective dummy cells, or the information about the levels of the erase permission voltages to be applied to dummy word lines depending on the differences between the program speeds of respective dummy cells. By means of this control, the erase operation control unit 101 may individually control the threshold voltages of the dummy cells.

In accordance with an embodiment of the present disclosure, the erase operation control unit 101 may apply erase permission voltages having different levels to dummy word lines depending on the program speeds of the dummy cells and may then control the timings at which the erase prohibition voltage Verase_pass is applied to respective dummy word lines.

For example, if a first reference time has elapsed since the application of erase permission voltages having different levels to the dummy word lines, the erase operation control unit 101 may apply the erase prohibition voltage Verase_pass to the dummy word line coupled to the first dummy cell having the highest program speed. If a second reference time longer than the first reference time has elapsed since the application of the erase permission voltages having different levels to the dummy word lines, the erase operation control unit 101 may apply the erase prohibition voltage Verase_pass to the dummy word line coupled to the second dummy cell having the next highest program speed. If an x-th reference time longer than an x−1-th reference time has elapsed since the application of the erase permission voltages having different levels to the dummy word lines, the erase operation control unit 101 may apply the erase prohibition voltage Verase_pass to the dummy word line coupled to the x-th dummy cell having the lowest program speed.

Figure 3:
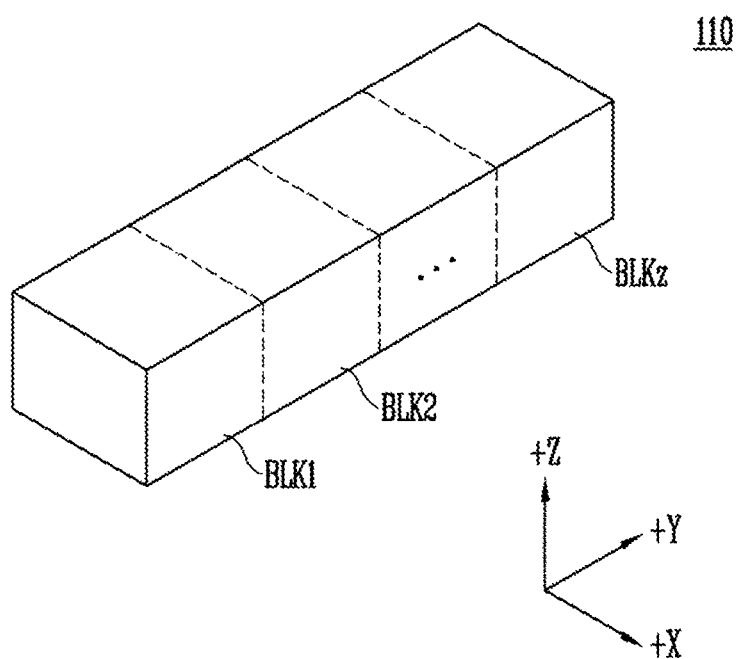
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block has a 3D structure. Each memory block includes a plurality of memory cells stacked on a substrate. Such memory cells are arranged along a positive X (+X) direction, a positive Y (+Y) direction, and a positive Z (+Z) direction. The structure of each memory block will be described below with reference to FIG. 4.

Figure 4:
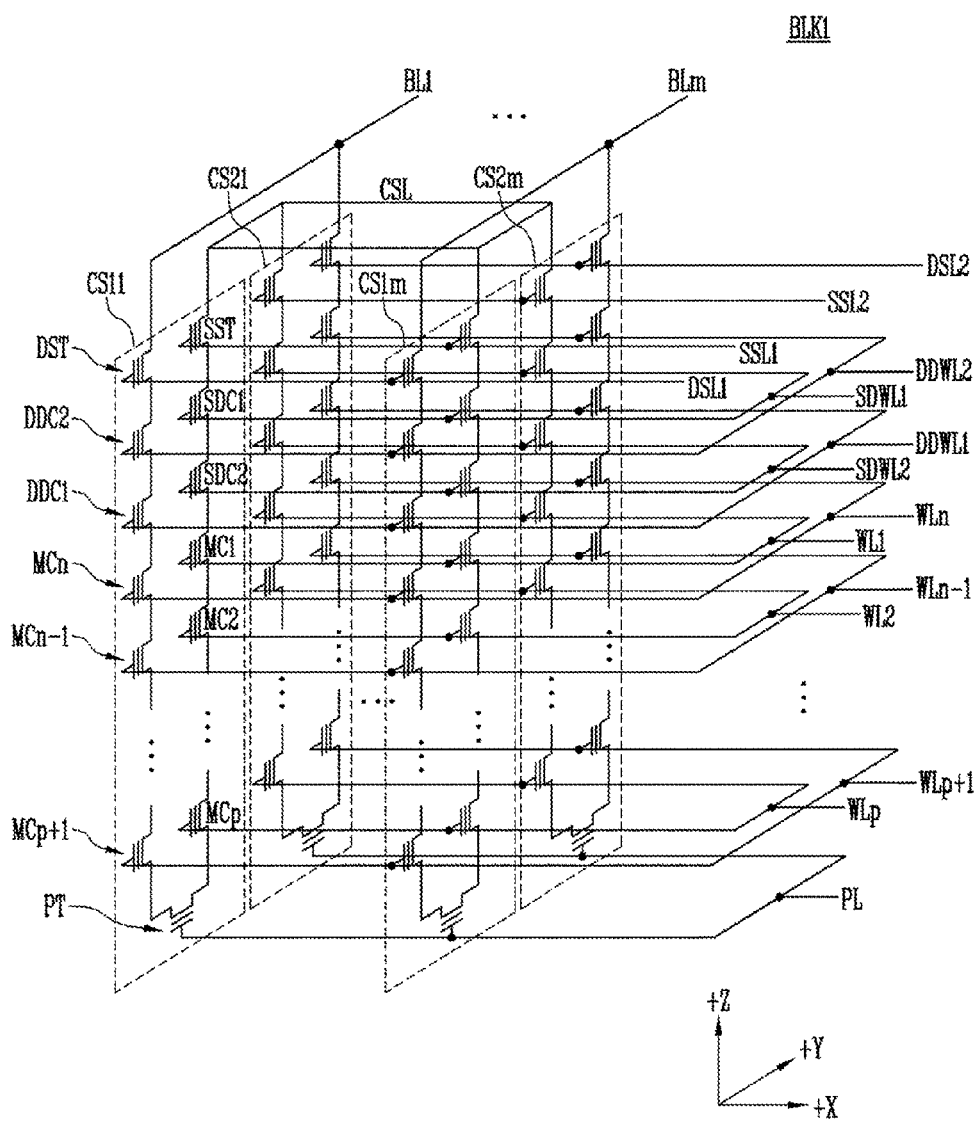
FIG. 4 is a circuit diagram illustrating any one of memory blocks of FIG. 3.

FIG. 4 is a circuit diagram illustrating any one (BLK1) of the memory blocks BLK1 to BLKz of FIG. 3.

Referring to FIG. 4, the first memory block BLK1 includes a plurality of cell strings CS11 to CS1m and CS21 to CS2m. In an embodiment, each of the cell strings CS11 to CS1m and CS21 to CS2m may be formed in a 'U' shape. In the first memory block BLK1, m cell strings are arranged in a row direction (i.e. +X direction). Referring to FIG. 4, two cell strings are illustrated as being arranged in a column direction (i.e. +Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, one or more source-side dummy memory cells SDC1 and SDC2, first to n-th normal memory cells MC1 to MCn, a pipe transistor PT, one or more drain-side dummy memory cells DDC1 and DDC2, and at least one drain select transistor DST.

The select transistors SST and DST, the dummy memory cells SDC1, SDC2, DDC1, and DDC2, and the normal memory cells MC1 to MCn may have similar structures, respectively. In an embodiment, each of the select transistors SST and DST, the dummy memory cells SDC1, SDC2, DDC1, and DDC2, and the normal memory cells MC1 to MCn may include a channel layer, a tunneling insulating layer, a charge storage layer, and a blocking insulating layer.

The source select transistor SST in each cell string is coupled between a common source line CSL and the source-side dummy memory cells SDC1 and SDC2.

In an embodiment, the source select transistors of cell strings arranged in the same row are coupled to a source select line extended in a row direction. The source select transistors of cell strings arranged in different rows are coupled to different source select lines. Referring to FIG. 4, the source select transistors of the cell strings CS11 to CS1m in a first row are coupled to a first source select line SSL1. The source select transistors of the cell strings CS21 to CS2m in a second row are coupled to a second source select line SSL2.

In each cell string, two source-side dummy memory cells SDC1 and SDC2 may be provided. However, this is only an example, and it will be understood that three or more source-side dummy memory cells may be provided in each cell string. The source-side dummy memory cells SDC1 and SDC2 in each cell string are connected in series between the source select transistor SST and the normal memory cells MC1 to MCp. The gate of the first source-side dummy memory cell SDC1 in each cell string is coupled to a first source-side dummy word line SDWL1. The gate of the second source-side dummy memory cell SDC2 is coupled to a second source-side dummy word line SDWL2.

The first to n-th normal memory cells MC1 to MCn in each cell string are coupled between the source-side dummy memory cells SDC1 and SDC2 and the drain-side dummy memory cells DDC1 and DDC2.

The first to n-th normal memory cells MC1 to MCn may be divided into first to p-th normal memory cells MC1 to MCp and p+1-th to n-th normal memory cells MCp+1 to MCn. The first to p-th normal memory cells MC1 to MCp are sequentially arranged in a direction opposite a positive (+) Z direction and are connected in series between the source-side dummy memory cells SDC1 and SDC2 and the pipe transistor PT. The p+1-th to n-th normal memory cells MCp+1 to MCn are sequentially arranged in the +Z direction and are connected in series between the pipe transistor PT and the drain-side dummy memory cells DDC1 and DDC2. The first to p-th normal memory cells MC1 to MCp and the p+1-th to n-th normal memory cells MCp+1 to MCn are coupled to each other through the pipe transistor PT. The gates of the first to n-th normal memory cells MC1 to MCn in each cell string are coupled to first to n-th normal word lines WL1 to WLn, respectively.

Data may be stored in the first to n-th normal memory cells MC1 to MCn through first to m-th bit lines BL1 to BLm. The data stored in the first to n-th normal memory cells MC1 to MCn may be read through the first to m-th bit lines BL1 to BLm.

The gate of the pipe transistor PT in each cell string is coupled to a pipeline PL.

In each cell string, two drain-side dummy memory cells DDC1 and DDC2 are provided. However, this is only an example, and it will be understood that three or more drain-side dummy memory cells may be provided in each cell string. The drain-side dummy memory cells DDC1 and DDC2 in each cell string are connected in series between the drain select transistor DST and the normal memory cells MCp+1 to MCn. The gate of the first drain-side dummy memory cell DDC1 in each cell string is coupled to a first drain-side dummy word line DDWL1. The gate of the second drain-side dummy memory cell DDC2 in each cell string is coupled to a second drain-side dummy word line DDWL2.

The drain select transistor DST in each cell string is coupled between the corresponding bit line and the drain-side dummy memory cells DDC1 and DDC2. The cell strings arranged in a row direction are coupled to drain select lines extended in the row direction. The drain select transistors of the cell strings CS11 to CS1m in a first row are coupled to a first drain select line DSL1. The drain select transistors of the cell strings CS21 to CS2m in a second row are coupled to a second drain select line DSL2.

Cell strings arranged in a column direction are coupled to bit lines extended in the column direction. Referring to FIG. 4, the cell strings CS11 and CS21 in a first column are coupled to a first bit line BL1. The cell strings CS1m and CS2m in an m-th column are coupled to an m-th bit line BLm.

In an embodiment, instead of the first to m-th bit lines BL1 to BLm, even bit lines and odd bit lines may be provided. Further, among the cell strings CS11 to CS1m or CS21 to CS2m arranged in a row direction, even-numbered cell strings may be coupled to the even bit lines, respectively. Among the cell strings CS11 to CS1m or CS21 to CS2m arranged in a row direction, odd-numbered cell strings may be coupled to the odd bit lines, respectively.

The dummy memory cells SDC1, SDC2, DDC1, and DDC2 are provided to stably control the voltage or current of the corresponding cell string. For example, the source-side dummy memory cells SDC1 and SDC2 are provided to reduce an electric field between the source select transistor SST and the normal memory cells MC1 to MCp. For example, the drain-side dummy memory cells DDC1 and DDC2 are provided to reduce an electric field between the drain select transistor DST and the normal memory cells MCp+1 to MCn. As more dummy memory cells are provided, the reliability of the operation of the memory block BLK1 is improved, but the size of the memory block BLK1 is increased. As fewer memory cells are provided, the size of the memory block BLK1 is reduced, but the reliability of the operation of the memory block BLK1 is deteriorated.

In order to efficiently control the dummy memory cells SDC1, SDC2, DDC1, and DDC2, the dummy memory cells SDC1, SDC2, DDC1, and DDC2 are required to have desired threshold voltages. Before an erase operation on the memory block BLK1 is performed, pre-program operations may be performed on all or some of the dummy memory cells SDC1, SDC2, DDC1, and DDC2. When the erase operation is performed after the pre-program operations have been performed, the dummy memory cells SDC1, SDC2, DDC1, and DDC2 may have desired threshold voltages by controlling voltages that are applied to the dummy word lines SDWL1, SDWL2, DDWL1, and DDWL2 coupled to respective dummy memory cells SDC1, SDC2, DDC1, and DDC2.

Figure 5:
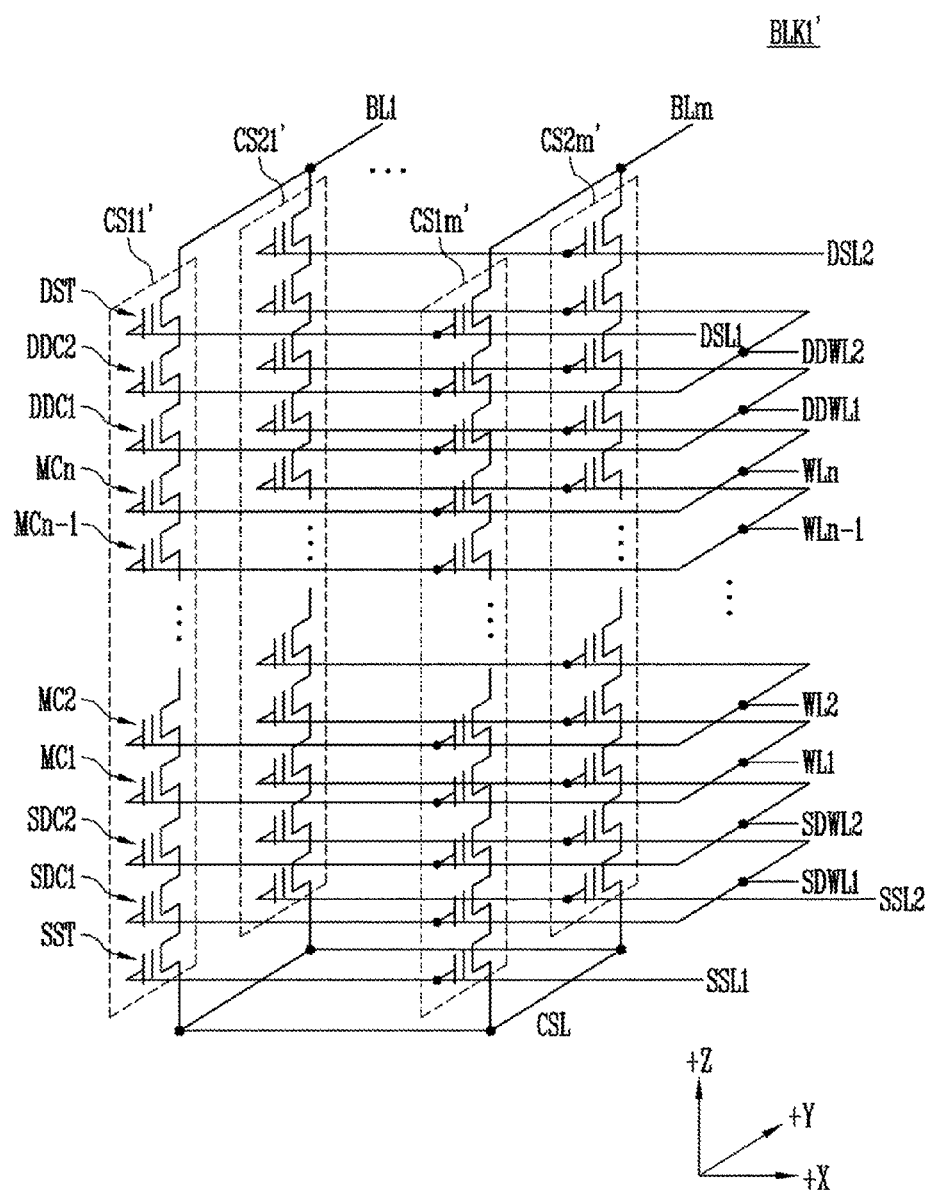
FIG. 5 is a circuit diagram illustrating other embodiments of any one of the memory blocks of FIG. 3.

FIG. 5 is a circuit diagram illustrating other embodiments (BLK1') of any one (BLK1) of the memory blocks BLK1 to BLKz illustrated in FIG. 3.

Referring to FIG. 5, the first memory block BLK1' includes a plurality of cell strings CS11' to CS1m' and CS21' to CS2m'. The plurality of cell strings CS11' to CS1m' and CS21' to CS2m' are extended along a positive Z (+Z) direction. Each of the cell strings CS11' to CS1m' and CS21' to CS2m' includes at least one source select transistor SST, one or more source-side dummy memory cells SDC1 and SDC2, first to n-th normal memory cells MC1 to MCn, one or more drain-side dummy memory cells DDC1 and DDC2, and at least one drain select transistor DST, which are stacked on a substrate (not illustrated) below the memory block BLK1'.

The source select transistor SST in each cell string is coupled between a common source line CSL and the source-side dummy memory cells SDC1 and SDC2. The source select transistors of cell strings (e.g. CS11' to CS1m') arranged in the same row are coupled to the same source select line (e.g. SSL1). The source select transistors of the cell strings CS11' to CS1m' arranged in a first row are coupled to a first source select line SSL1. The source select transistors of the cell strings CS21' to CS2m' arranged in a second row are coupled to a second source select line SSL2.

The source-side dummy memory cells SDC1 and SDC2 in each cell string are connected in series between the source select transistor SST and the normal memory cells MC1 to MCn. The source-side dummy memory cells arranged at the same height are coupled to the same source-side dummy word line. The gates of the first and second source-side dummy memory cells SDC1 and SDC2 are coupled to first and second source-side dummy word lines SDWL1 and SDWL2, respectively.

The first to n-th normal memory cells MC1 to MCn in each cell string are connected in series between the source-side dummy memory cells SDC1 and SDC2 and the drain-side dummy memory cells DDC1 and DDC2. The gates of the first to n-th normal memory cells MC1 to MCn are coupled to first to n-th normal word lines WL1 to WLn, respectively.

The drain-side dummy memory cells DDC1 and DDC2 in each cell string are connected in series between the drain select transistor DST and the normal memory cells MC1 to MCn. The drain-side dummy memory cells arranged at the same height are coupled to the same drain-side dummy word line. The first and second drain-side dummy memory cells DDC1 and DDC2 are coupled to first and second drain-side dummy word lines DDWL1 and DDWL2, respectively.

The drain select transistor DST in each cell string is coupled between the corresponding bit line and the drain-side dummy memory cells DDC1 and DDC2. The drain select transistors of cell strings arranged in a row direction are coupled to drain select lines extended in the row direction. The drain select transistors of the cell strings CS11' to CS1m' in a first row are coupled to a first drain select line DSL1. The drain select transistors of the cell strings CS21' to CS2m' in a second row are coupled to a second drain select line DSL2.

As a result, the memory block BLK1' of FIG. 5 has an equivalent circuit similar to that of the memory block BLK1 of FIG. 4 except that a pipe transistor PT is excluded from each cell string.

Hereinafter, embodiments of the present disclosure will be described based on the memory block BLK1 of FIG. 4 for the convenience of description.

Figure 6:
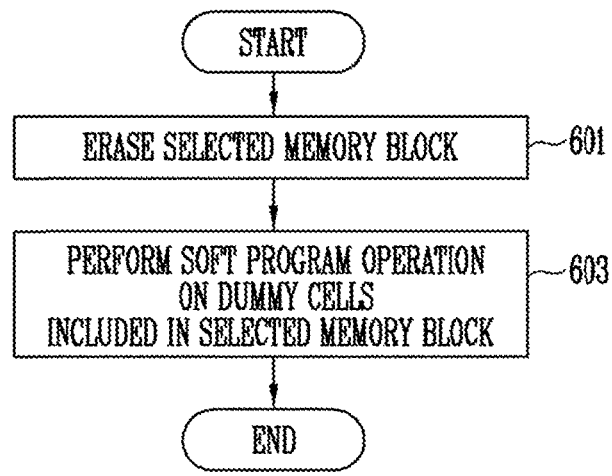
FIG. 6 is a flowchart for explaining an erase operation of a conventional semiconductor memory device.

FIG. 6 is a flowchart for explaining an erase operation of a conventional semiconductor memory device.

Referring to FIG. 6, the erase operation of the conventional semiconductor memory device may be divided into an erase step and a soft program execution step.

At step 601, the semiconductor memory device may erase data from a selected memory block. While the erase operation is performed, the semiconductor memory device generates an erase voltage Verase and applies the generated erase voltage Verase to the common source line CSL (source bias). Here, the source select transistor SST and the drain select transistor DST are controlled to be in a floating state.

An erase permission voltage (e.g. a ground voltage) may be applied to the local word lines of the selected memory block. Thereafter, the potential levels of channels are increased depending on the potential level of the common source line CSL. Depending on the potential levels of the channels, the potential levels of the source select lines and drain select lines, which are coupled to the plurality of source select transistors and drain select transistors being in a floating state, may be increased due to a coupling phenomenon.

Pieces of data stored in the memory cells are erased due to the increased potential levels of the channels. Electrons stored in the charge storage layers of the memory cells are detrapped by the potentials of the channels due to FN tunneling. This operation will be described below. That is, depending on differences between the increased potential levels of the channels and the potential levels of local word lines having a ground level, the electrons stored in the charge storage layers of the memory cells may be emitted through the channels and detrapped or, alternatively, hot holes generated in the channels may flow into the charge storage layers of the memory cells and then the electrons stored in the charge storage layers are detrapped. Here, the local word lines may be maintained at the ground level or may be changed from the floating state to the ground level.

After the data in the memory cells has been erased by the erase operation, the erase voltage Verase applied to the common source line CSL is blocked, and the potential of the common source line CSL is discharged.

When the erase voltage Verase having a high voltage level is applied to the common source line CSL during the erase operation, the source select transistor is in a floating state, so that a Gate Induced Drain Leakage (GIDL) is produced due to a voltage difference from a source-side voltage, and hot holes are generated and flow into the channels, thus increasing the potentials of the channels. At this time, the bit line is maintained in a floating state.

At step 603, the semiconductor memory device performs a soft program operation on dummy cells included in the selected memory block. The dummy cells are provided to stably control the voltage or current of the corresponding cell string. The source-side dummy cells are provided to reduce an electric field between the source select transistor SST and the normal memory cells. The drain-side dummy cells are provided to reduce an electric field between the drain select transistor DST and the normal memory cells. As more dummy memory cells are provided, the reliability of the operation of the memory block is improved, but the size of the memory block is increased. As fewer memory cells are provided, the size of the memory block is reduced, but the reliability of the operation of the memory block may be deteriorated. In order to efficiently control the dummy cells, the dummy memory cells are required to have desired threshold voltages. A soft program may be a program operation on the dummy cells, which is performed after the erase operation, so as to adjust the threshold voltages of the dummy cells.

Figure 7:
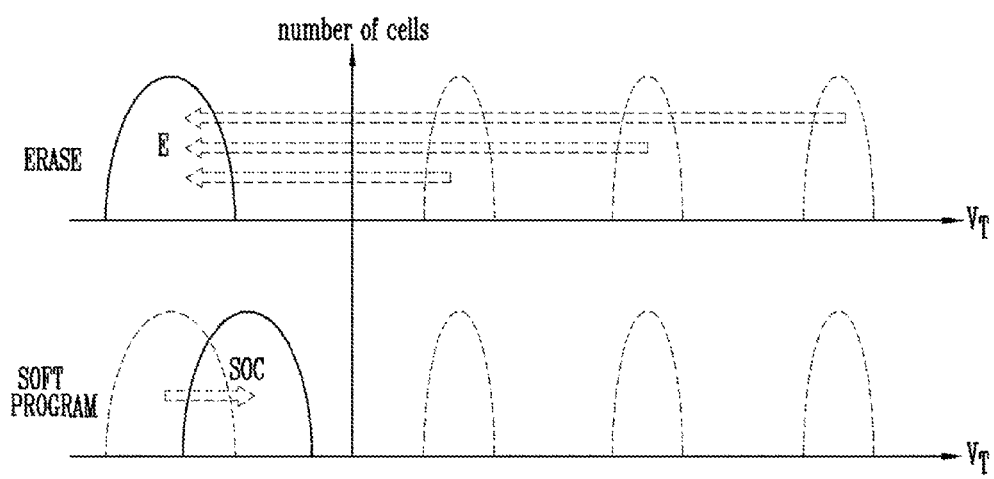
FIG. 7 is a diagram for explaining variation in the threshold voltage distribution of memory cells depending on the erase operation of FIG. 6.

FIG. 7 is a diagram for explaining variation in the threshold voltage distribution of memory cells depending on the erase operation of FIG. 6.

Referring to FIG. 7, dummy cells have threshold voltages in an erase state (E) through an erase step. When a soft program operation (Soft PGM on Chip; SOC) is performed to adjust the threshold voltages of the dummy cells, the threshold voltages of the dummy cells may be programmed to have voltage levels slightly higher than voltage levels in the erase state (E).

Figure 8:
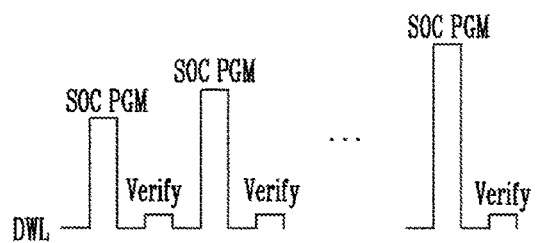
FIG. 8 is a diagram for explaining voltages applied to dummy word lines during a soft program operation of FIG. 6.

FIG. 8 is a diagram for explaining voltages applied to the dummy word lines during the soft program of FIG. 6.

Figure 9:
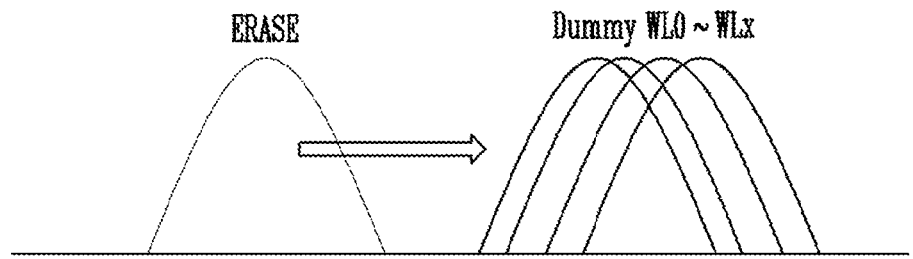
FIG. 9 is a diagram for explaining variation in the threshold voltage distribution of dummy cells depending on the soft program operation of FIG. 8.

FIG. 9 is a diagram for explaining variation in the threshold voltage distribution of dummy cells depending on the soft program operation of FIG. 8.

Referring to FIG. 8, at a soft program step, a soft program voltage pulse and a verification voltage may be repeatedly applied to dummy word lines DWL to which dummy cells are coupled. That is, an operation of applying the soft program voltage pulse and a verify operation may be repeatedly performed until the threshold voltages of the dummy cells reach preset threshold voltages.

Each memory block may include a plurality of dummy cells. Respective dummy cells may have different program speeds. The program speeds of the dummy cells may be determined based on the locations of the dummy cells. For example, the program speed of dummy cells closer to the common source line may be higher than that of dummy cells far away from the common source line. Alternatively, the program speeds of the dummy cells may be different from each other depending on whether the dummy cells are adjacent to select transistors. Alternatively, in the structure of a memory cell array in which memory cells are stacked in a vertical direction, the program speeds of the dummy cells may be different from each other depending on the thickness of channels.

In the conventional soft program operation, the same soft program voltage pulse may be applied to all of the dummy cells.

Referring to FIG. 9, since the program speeds of the dummy cells are different from each other, the threshold voltage distributions of the dummy cells may be different from each other, rather than being uniform, if the soft program operation using the same soft program voltage pulse is performed. The reason for this is that the same soft program voltage is applied to the dummy word lines without considering differences between the program speeds of the dummy cells.

Further, a problem arises in that the time required for the operation of erasing data from the memory cells increases due to the execution of the soft program that is executed to form the threshold voltage distributions of dummy cells.

In order to solve these problems, an embodiment of the present disclosure proposes a semiconductor memory device and a method of operating the semiconductor memory device, which execute a pre-program before data is erased from the selected memory block, without executing the soft program, and which control the threshold voltages of dummy cells at an erase step.

Figure 10:
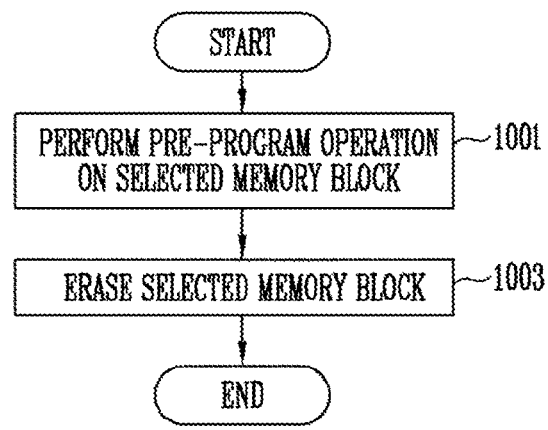
FIG. 10 is a flowchart for explaining a method of operating a semiconductor memory device according to an embodiment of the present disclosure.

FIG. 10 is a flowchart for explaining a method of operating the semiconductor memory device according to an embodiment of the present disclosure.

Referring to FIG. 10, at step 1001, the semiconductor memory device may perform a pre-program operation on a selected memory block. For this operation, the semiconductor memory device may apply a pre-program pulse to word lines coupled to the selected memory block. In an embodiment, the word lines may include normal word lines and dummy word lines. In an embodiment, the semiconductor memory device may not perform a verify operation in the pre-program operation. In an embodiment, the level of the pre-program pulse that is applied in the pre-program operation may be equal to that of the soft program pulse that is applied in the soft program operation according to the embodiment of FIG. 8.

At step 1003, the semiconductor memory device erases data from the selected memory block. In accordance with an embodiment of the present disclosure, the semiconductor memory device may control the threshold voltages of respective dummy cells by controlling a degree at which dummy cells are erased when erasing data from the selected memory block. In an embodiment, the semiconductor memory device may individually control the threshold voltages of respective dummy cells depending on the differences between the program speeds of the dummy cells.

A method of individually controlling the threshold voltages of respective dummy cells according to an embodiment of the present disclosure will be described below with reference to FIGS. 11 to 14.

Figure 11:
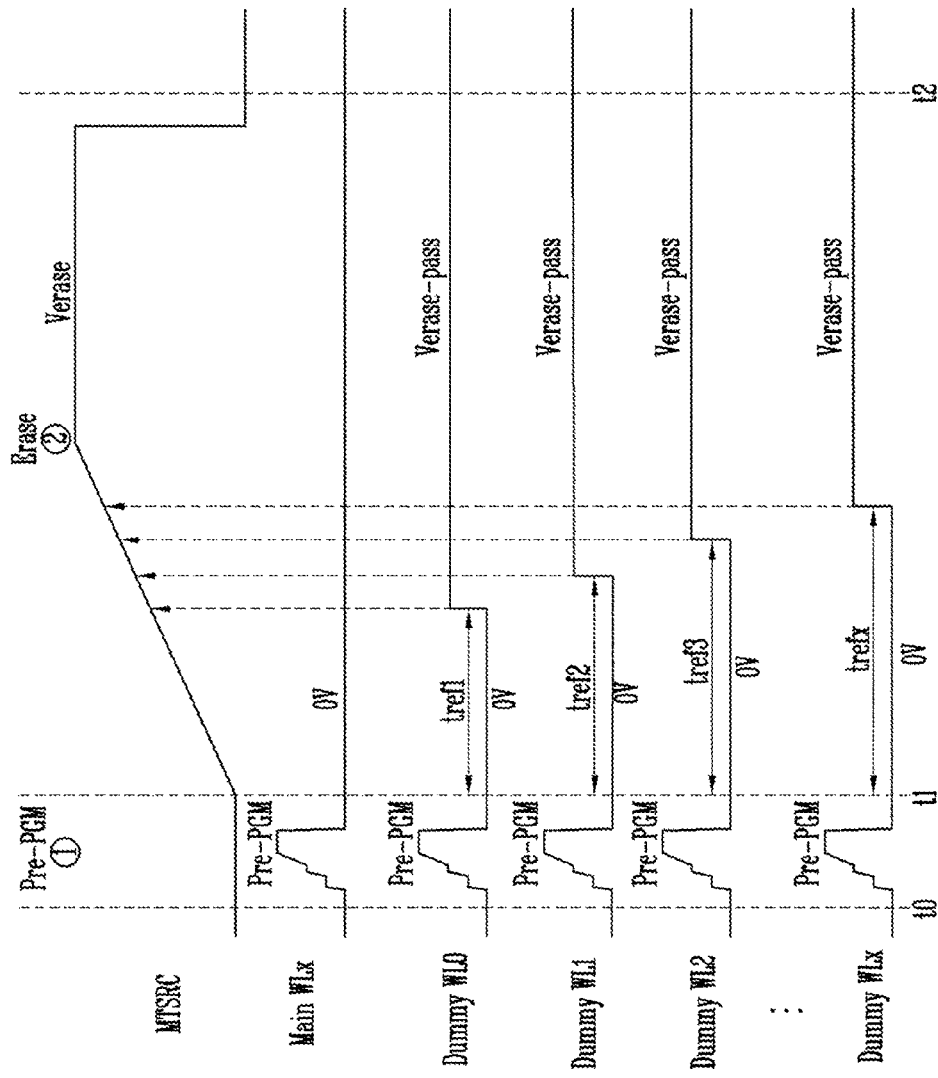
FIG. 11 is a diagram for explaining an example of waveforms of voltages applied to dummy word lines in the method of operating the semiconductor memory device according to an embodiment of the present disclosure.

FIG. 11 is a diagram for explaining an example of waveforms of voltages applied to dummy word lines in the method of operating the semiconductor memory device according to an embodiment of the present disclosure.

Referring to FIG. 11, the method of operating the semiconductor memory device according to an embodiment of the present disclosure may be divided into a pre-program step Pre-PGM ① and an erase step Erase ②.

The pre-program step ① is performed during an interval from t0 to t1, and the erase step ② is performed during an interval from t1 to t2.

During the interval from t0 to t1, a pre-program voltage pulse Pre-PGM may be applied to word lines coupled to a selected memory block. For example, the pre-program voltage pulse Pre-PGM is applied to normal word lines (Main WLx) to which normal memory cells are coupled, and dummy word lines (Dummy WL0 to Dummy WLx) to which dummy cells are coupled. In an embodiment, the voltage level of the pre-program voltage pulse Pre-PGM may be equal to the level of a soft program voltage pulse applied in the soft program operation, which has been described with reference to FIG. 8. When the pre-program voltage pulse Pre-PGM is applied, the threshold voltages of the normal memory cells and the dummy cells may be increased.

At time t1, an erase voltage Verase is applied to a node MTSRC coupled to the common source line. With the application of the erase voltage, the voltage of the node MTSRC coupled to the common source line may be increased up to the erase voltage Verase.

At time t1, an erase permission voltage (0 V) may be applied both to the normal word lines (Main WLx) and to the dummy word lines (Dummy WL0 to Dummy WLx) to which the dummy cells are coupled.

In a section, in which the voltage of the node MTSRC coupled to the common source line is increased, during the interval from t1 to t2, an erase prohibition voltage Verase_pass may be applied to respective dummy word lines at certain times.

In accordance with an embodiment of the present disclosure, the timings at which the erase prohibition voltage Verase_pass is applied to the dummy word lines are controlled so that they are different from each other depending on differences between the program speeds of the dummy cells.

If a first reference time tref1 has elapsed since the application of the erase permission voltage (0 V) to the dummy word lines, the semiconductor memory device may apply the erase prohibition voltage Verase_pass to the dummy word line (Dummy WL0) having the highest program speed. If a second reference time tref2 longer than the first reference time tref1 has elapsed since the application of the erase permission voltage (0 V) to the dummy word lines, the semiconductor memory device may apply the erase prohibition voltage Verase_pass to the dummy word line (Dummy WL1) having the next highest program speed. That is, the semiconductor memory device may control respective dummy word line voltages so that the erase prohibition voltage Verase_pass is sequentially applied in the sequence of dummy word lines ranging from the dummy word line (Dummy WL0), coupled to a dummy cell having a relatively high program speed, to the dummy word line (Dummy WLx), coupled to a dummy cell having a relatively low program speed, among the plurality of dummy cells included in the selected memory block. By means of this operation, the threshold voltage distributions of the dummy cells may be formed to be identical.

At time t2, the semiconductor memory device blocks the erase voltage Verase applied to the node MTSRC to which the common source line is coupled and discharges the potential of the common source line.

Figure 12:
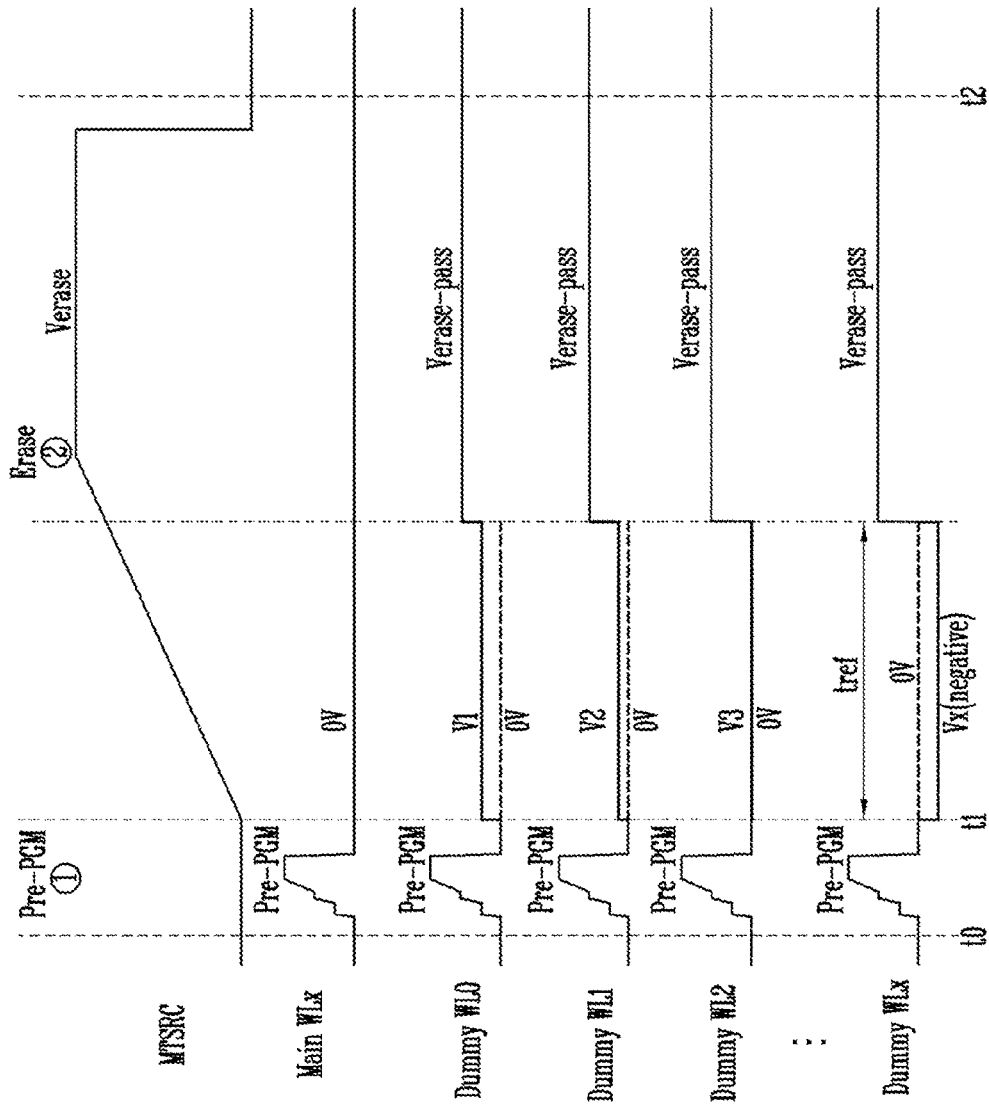
FIG. 12 is a diagram for explaining an example of waveforms of voltages applied to dummy word lines in the method of operating the semiconductor memory device according to an embodiment of the present disclosure.

FIG. 12 is a diagram for explaining other examples of waveforms of voltages applied to dummy word lines in the method of operating the semiconductor memory devices according to an embodiment of the present disclosure.

Referring to FIG. 12, the method of operating the semiconductor memory device according to other embodiments of the present disclosure may be divided into a pre-program step Pre-PGM ① and an erase step Erase ②.

The pre-program step ① is performed during an interval from t0 to t1, and the erase step ② is performed during an interval from t1 to t2.

During the interval from t0 to t1, a pre-program voltage pulse Pre-PGM may be applied to word lines coupled to a selected memory block. For example, the pre-program voltage pulse Pre-PGM is applied to normal word lines (Main WLx) to which normal memory cells are coupled, and dummy word lines (Dummy WL0 to Dummy WLx) to which dummy cells are coupled. In an embodiment, the voltage level of the pre-program voltage pulse Pre-PGM may be equal to the level of a soft program voltage pulse applied in the soft program operation, which has been described with reference to FIG. 8. When the pre-program voltage pulse Pre-PGM is applied, the threshold voltages of the normal memory cells and the dummy cells may be increased.

At time t1, an erase voltage Verase is applied to a node MTSRC coupled to the common source line. With the application of the erase voltage, the voltage of the node MTSRC coupled to the common source line is increased up to the erase voltage Verase.

In accordance with other embodiments of the present disclosure, the semiconductor memory devices may apply an erase permission voltage having a voltage level higher than that of a ground voltage to a dummy word line, coupled to a dummy cell having a relatively high program speed, among the plurality of dummy cells included in the selected memory block, and may apply an erase permission voltage having a voltage level lower than that of the ground voltage to a dummy word line, coupled to a dummy cell having a relatively low program speed.

For example, at time t1, 0 V may be applied to normal word lines (Main WLx), and erase permission voltages V1 to Vx having different voltage levels may be applied to respective dummy word lines (Dummy WL0 to Dummy WLx) to which the dummy cells are coupled.

For example, when the erase voltage Verase is applied to a node MTSRC coupled to the common source line, the semiconductor memory device may apply a first erase permission voltage V1 having a voltage level higher than that of the ground voltage to a dummy word line (Dummy WL0) coupled to a dummy cell having the highest program speed, may apply a second erase permission voltage V2 having a voltage level lower than that of the first erase permission voltage V1 to a dummy word line (Dummy WL1) coupled to a dummy cell having the next highest program speed, and may apply an x-th erase permission voltage Vx having the lowest voltage level to a dummy word line (Dummy WLx) coupled to a dummy cell having the lowest program speed. In an embodiment, the erase permission voltages applied to dummy word lines may have negative voltage levels lower than 0 V.

If a reference time tref has elapsed since the erase permission voltages V1 to Vx having different voltage levels were applied to respective dummy word lines (Dummy WL0 to Dummy WLx) in a section in which the voltage of the node MTSRC coupled to the common source line is increased during the interval from t1 to t2, the erase prohibition voltage Verase_pass may be applied to the dummy word lines (Dummy WL0 to Dummy WLx). In an embodiment of FIG. 12, the reference time tref during which the erase prohibition voltage Verase_pass is applied to the dummy word lines (Dummy WL0 to Dummy WLx) may be controlled to an identical time. However, in the section in which the voltage of the node MTSRC coupled to the common source line is increased, the erase permission voltages V1 to Vx having different voltage levels are applied to respective dummy word lines (Dummy WL0 to Dummy WLx), and thus the threshold voltage distributions of the dummy cells may be formed to be identical.

At time t2, the semiconductor memory device blocks the erase voltage Verase applied to the node MTSRC to which the common source line is coupled, and discharges the potential of the common source line.

Figure 13:
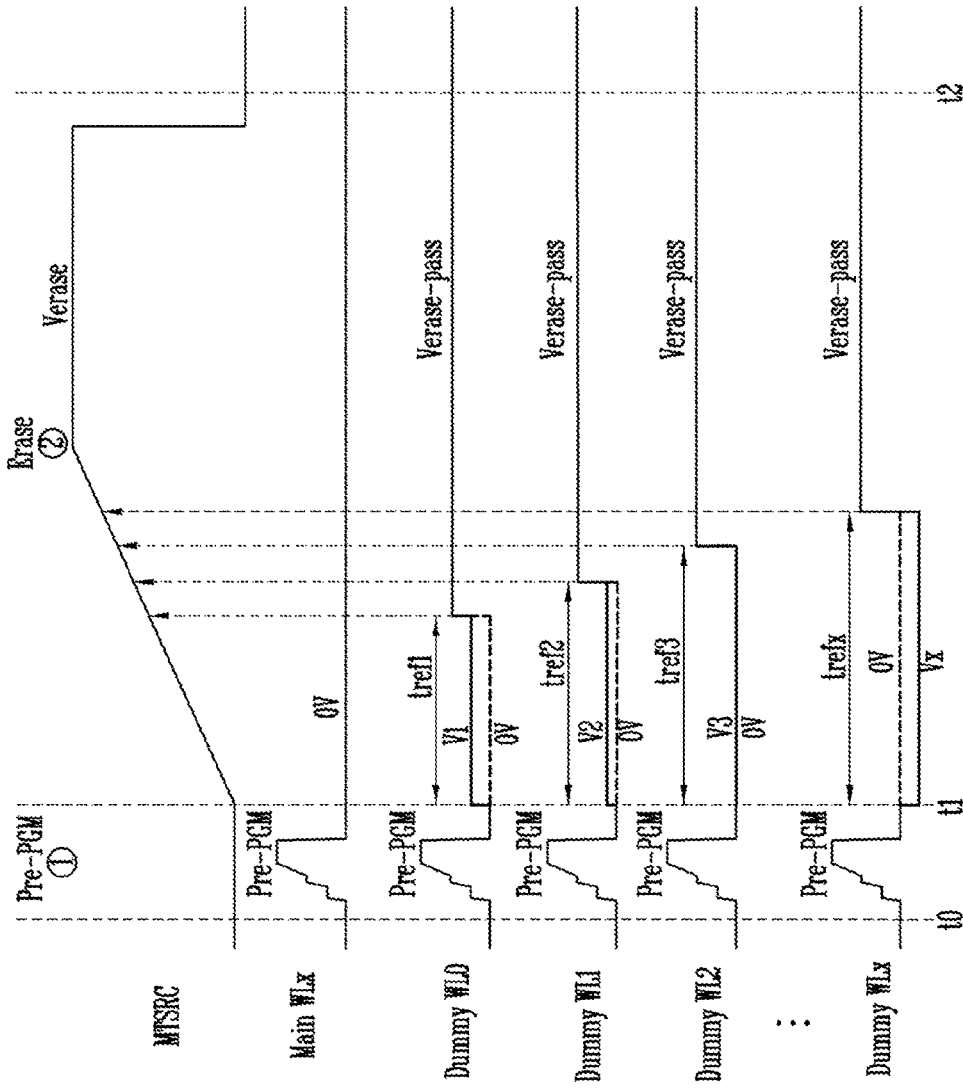
FIG. 13 is a diagram for explaining a further example of waveforms of voltages applied to dummy word lines in the method of operating the semiconductor memory device according to an embodiment of the present disclosure.

FIG. 13 is a diagram for explaining a further example of waveforms of voltages applied to dummy word lines in a method of operating a semiconductor memory device according to an embodiment of the present disclosure.

The embodiment of FIG. 13 is obtained by applying the embodiments of FIG. 11 and the embodiments of FIG. 12.

Referring to FIG. 13, the method of operating the semiconductor memory device according to the other embodiments of the present disclosure may be divided into a pre-program step Pre-PGM ① and an erase step Erase ②.

The pre-program step ① is performed during an interval from t0 to t1, and the erase step ② is performed during an interval from t1 to t2.

During the interval from t0 to t1, a pre-program voltage pulse Pre-PGM may be applied to word lines coupled to a selected memory block. For example, the pre-program voltage pulse Pre-PGM is applied to normal word lines (Main WLx) to which normal memory cells are coupled, and dummy word lines (Dummy WL0 to Dummy WLx) to which dummy cells are coupled. In an embodiment, the voltage level of the pre-program voltage pulse Pre-PGM may be equal to the level of a soft program voltage pulse applied in the soft program operation, which has been described with reference to FIG. 8. When the pre-program voltage pulse Pre-PGM is applied, the threshold voltages of the normal memory cells and the dummy cells may be increased.

At time t1, an erase voltage Verase is applied to a node MTSRC coupled to the common source line. With the application of the erase voltage, the voltage of the node MTSRC coupled to the common source line is increased up to the erase voltage Verase.

At time t1, 0 V may be applied to normal word lines (Main WLx), and erase permission voltages V1 to Vx having different voltage levels may be applied to respective dummy word lines (Dummy WL0 to Dummy WLx) to which the dummy cells are coupled.

When the erase voltage Verase is applied to a node MTSRC coupled to the common source line, the semiconductor memory device may apply a first erase permission voltage V1 having a voltage level higher than that of the ground voltage to a dummy word line (Dummy WL0) coupled to a dummy cell having the highest program speed, may apply a second erase permission voltage V2 having a voltage level lower than that of the first erase permission voltage V1 to a dummy word line (Dummy WL1) coupled to a dummy cell having the next highest program speed, and may apply an x-th erase permission voltage Vx having the lowest voltage level to a dummy word line (Dummy WLx) coupled to a dummy cell having the lowest program speed. In an embodiment, the erase permission voltages applied to dummy word lines may have negative voltage levels lower than 0 V.

If a first reference time tref1 has elapsed since the erase permission voltages V1 to Vx having different voltage levels were applied to the dummy word lines, the semiconductor memory device may apply an erase prohibition voltage Verase_pass to a dummy word line (Dummy WL0) having the highest program speed. If a second reference time tref2 longer than the first reference time tref1 has elapsed since the erase permission voltages V1 to Vx having different voltage levels were applied to the dummy word lines, the semiconductor memory device may apply the erase prohibition voltage Verase_pass to the dummy word line (Dummy WL1) having the next highest program speed. That is, the semiconductor memory device may control respective dummy word line voltages so that the erase prohibition voltage Verase_pass is sequentially applied in the sequence of dummy word lines ranging from the dummy word line (Dummy WL0) coupled to a dummy cell having a relatively high program speed to the dummy word line (Dummy WLx) coupled to a dummy cell having a relatively low program speed, among the plurality of dummy cells included in the selected memory block.

In accordance with the embodiments of FIGS. 11 to 13, the semiconductor memory device may individually control the threshold voltages of respective dummy cells by controlling at least one of the levels of erase permission voltages which are to be applied to the dummy word lines, and the timings at which the erase prohibition voltage is applied to respective dummy word lines.

Figure 14:
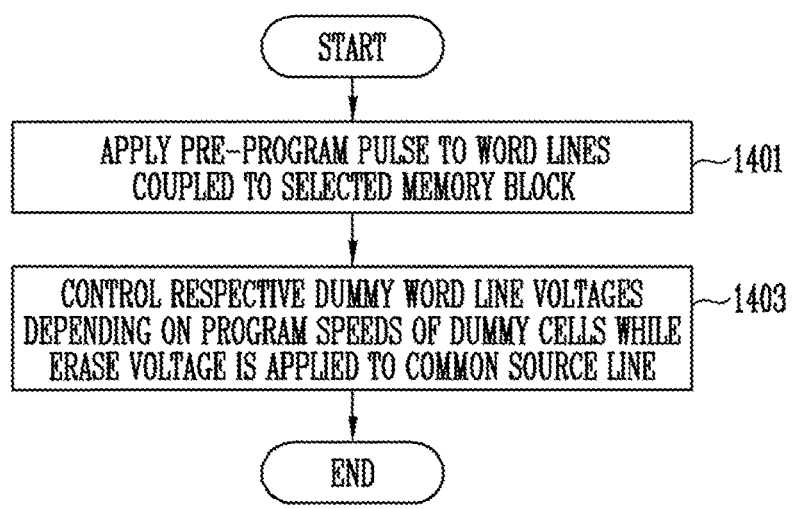
FIG. 14 is a flowchart for explaining the method of operating the semiconductor memory device, illustrated in FIG. 10.

FIG. 14 is a flowchart for explaining a method of operating the semiconductor memory device, illustrated in FIG. 10;

Referring to FIG. 14, at step 1401, the semiconductor memory device may apply a pre-program voltage pulse to word lines included in a selected memory block. In an embodiment, the word lines may include normal word lines and dummy word lines. In an embodiment, the semiconductor memory device may not perform a verify operation in a pre-program operation. In an embodiment, the level of the pre-program pulse applied in the pre-program operation may be identical to the level of a soft program pulse applied in the soft program operation according to the embodiment of FIG. 8.

At step 1403, the semiconductor memory device may control dummy word line voltages that are applied to respective dummy word lines depending on the program speeds of dummy cells while an erase voltage is applied to a common source line. For example, the semiconductor memory device applies the erase voltage Verase to the common source line. In this case, the semiconductor memory device may apply an erase permission voltage (e.g. a ground voltage) to the normal word lines and dummy word lines, which are coupled to the selected memory block. The semiconductor memory device may control a degree at which the dummy memory cells are erased while the erase voltage Verase is applied to the common source line. If a preset reference time has elapsed during an interval in which the voltage of the common source line is increased, a semiconductor memory device may apply an erase prohibition voltage Verase_pass to the dummy word lines. That is, after a predetermined time has elapsed since the application of the erase permission voltage, if the erase prohibition voltage Verase_pass is applied to the dummy word lines, the threshold voltages of the dummy cells may not be further decreased.

The semiconductor memory device may control timings at which the erase prohibition voltage Verase_pass is applied to the dummy word lines so that they are different from each other depending on differences between the program speeds of the dummy cells. The semiconductor memory device may control respective dummy word line voltages so that the erase prohibition voltage Verase_pass is sequentially applied in the sequence of dummy word lines ranging from a dummy word line, coupled to a dummy cell having a relatively high program speed, to a dummy word line, coupled to a dummy cell having a relatively low program speed, among the plurality of dummy cells included in the selected memory block.

For example, if a first reference time has elapsed since the application of the erase permission voltage (e.g. the ground voltage) to the dummy word lines, the semiconductor memory device may apply the erase prohibition voltage Verase_pass to the dummy word line, which is coupled to a first dummy cell having the highest program speed. If a second reference time that is longer than the first reference time has elapsed since the application of the erase permission voltage (ground voltage) to the dummy word lines, the semiconductor memory device may apply the erase prohibition voltage Verase_pass to the dummy word line, which is coupled to a second dummy cell having the next highest program speed. If an x-th reference time longer than an x−1-th reference time has elapsed since the application of the erase permission voltage (ground voltage) to the dummy word lines, the semiconductor memory device may apply the erase prohibition voltage Verase_pass to the dummy word line, which is coupled to an x-th dummy cell having the lowest program speed.

In an embodiment of the present disclosure, the semiconductor memory device may apply the ground voltage to the normal word lines and apply erase permission voltages having different levels to the dummy word lines depending on the program speeds of the dummy cells when the erase voltage Verase is applied to the common source line. For example, the semiconductor memory device may apply an erase permission voltage having a voltage level higher than that of the ground voltage to dummy word line, coupled to a dummy cell having a relatively high program speed, among the plurality of dummy cells included in the selected memory block, and may apply an erase permission voltage having a voltage level lower than that of the ground voltage to a dummy word line, coupled to a dummy cell having a relatively low program speed. If a preset reference time has elapsed since the application of erase permission voltages having different levels to respective dummy word lines, the semiconductor memory device may apply the erase prohibition voltage Verase_pass to the respective dummy word lines.

For example, when the erase voltage Verase is applied to the common source line, the semiconductor memory device may apply a first erase permission voltage V1 having a voltage level higher than that of the ground voltage to the first dummy word line coupled to the first dummy cell having the highest program speed, may apply a second erase permission voltage V2 having a voltage level lower than that of the first erase permission voltage V1 to a second dummy word line coupled to the second dummy cell having the next highest program speed, and may apply an x-th erase permission voltage Vx having a voltage level lower than that of an x−1-th erase permission voltage Vx−1 to a dummy word line coupled to the x-th dummy cell having the lowest program speed. Here, the semiconductor memory device may apply the ground voltage to the normal word lines to erase data from the memory cells. In an embodiment, the erase permission voltages that are applied to the dummy word lines may have negative voltage levels lower than 0 V. If the reference time has elapsed since the application of the erase permission voltages to the word lines, the semiconductor memory device may apply the erase prohibition voltage Verase_pass to the dummy word lines.

In an embodiment of the present disclosure, the semiconductor memory device may apply erase permission voltages having different levels to dummy word lines depending on the program speeds of the dummy cells and may then control the timings at which the erase prohibition voltage Verase_pass is applied to respective dummy word lines.

For example, if a first reference time has elapsed since the application of erase permission voltages having different levels to the dummy word lines, the semiconductor memory device may apply the erase prohibition voltage Verase_pass to the dummy word line coupled to the first dummy cell having the highest program speed. If a second reference time longer than the first reference time has elapsed since the application of the erase permission voltages having different levels to the dummy word lines, the semiconductor memory device may apply the erase prohibition voltage Verase_pass to the dummy word line coupled to the second dummy cell having the next highest program speed. If an x-th reference time longer than an x−1-th reference time has elapsed since the application of the erase permission voltages having different levels to the dummy word lines, the semiconductor memory device may apply the erase prohibition voltage Verase_pass to the dummy word line coupled to the x-th dummy cell having the lowest program speed.

Figure 15:
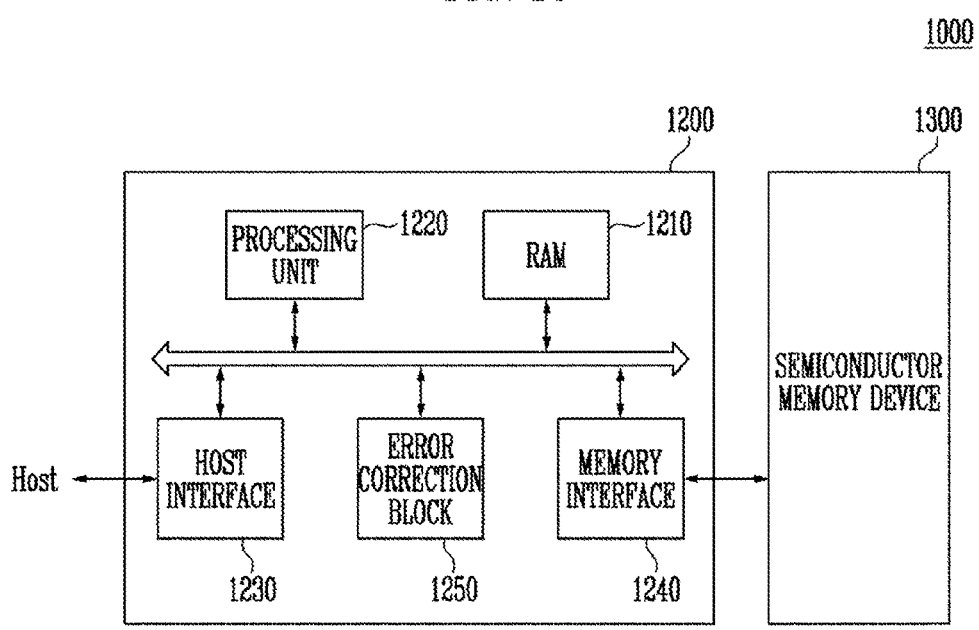
FIG. 15 is a block diagram illustrating a memory system including the semiconductor memory device of FIG. 2.

FIG. 15 is a block diagram illustrating a memory system 1000 including a semiconductor memory device of FIG. 2.

Referring to FIG. 15, the memory system 1000 includes a semiconductor memory device 1300 and a controller 1200.

The semiconductor memory device 1300 may have the same configuration and operation as the semiconductor memory device 100 described above with reference to FIG. 2. Hereinafter, repetitive explanations will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the host Host and the semiconductor memory device 1300. The controller 1200 is configured to run firmware for controlling the semiconductor memory device 1300.

The controller 1200 includes a RAM (Random Access Memory) 1210, a processing unit 1220, a host interface 1230, a memory interface 1240, and an error correction block 1250.

The RAM 1210 is used as any one of a work memory of the processing unit 1220, a cache memory between the semiconductor memory device 1300 and the host Host, and a buffer memory between the semiconductor memory device 1300 and the host Host.

The processing unit 1220 controls the overall operation of the controller 1200. The processing unit 1220 is configured to control a read operation, a program operation, an erase operation and a background operation of the semiconductor memory device 1300. The memory control unit 1220 is configured to run firmware for controlling the semiconductor memory device 1300. The processing unit 1220 may perform a function of a Flash Translation Layer (FTL). The processing unit 1220 may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The processing unit 1220 is configured to randomize data received from the host Host. For example, the processing unit 1220 may randomize the data received from the host Host using a randomizing seed. The randomized data is provided, as data to be stored, to the semiconductor memory device 1300 and is then programmed in the memory cell array.

The processing unit 1220 is configured to derandomize the data received from the semiconductor memory device 1300 during a read operation. For example, the processing unit 1220 may derandomize the data received from the semiconductor memory device 1300 using a derandomizing seed. The derandomized data may be outputted to the host Host.

In an embodiment, the processing unit 1220 may perform randomize and derandomize operations by running software or firmware.

The host interface 1230 includes a protocol for performing data exchange between the host Host and the controller 1200. In an example of an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 interfaces with the semiconductor memory device 1300. For example, the memory interface 1240 includes a NAND interface or NOR interface.

The error correction block 1250 is configured to use an error correcting code (ECC) to detect and correct an error in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fail. When a number of error bits less than or equal to the number of correctable bits are included in the page data, decoding may succeed. A success in decoding indicates that the corresponding read command has passed. A failure in decoding indicates that the corresponding read command has failed. When decoding succeeds, the controller 1200 outputs error-corrected page data to the host.

The controller 1200 and the semiconductor memory device 1300 may be integrated into a single semiconductor device. In an example of an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data in a semiconductor memory. When the memory system is used as the SSD, an operation speed of the host Host coupled to the memory system may be phenomenally improved.

In an embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an example of an embodiment, the semiconductor memory device 1300 or the memory system may be embedded in various types of packages. For example, the semiconductor memory device 1300 or the memory system may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 16:
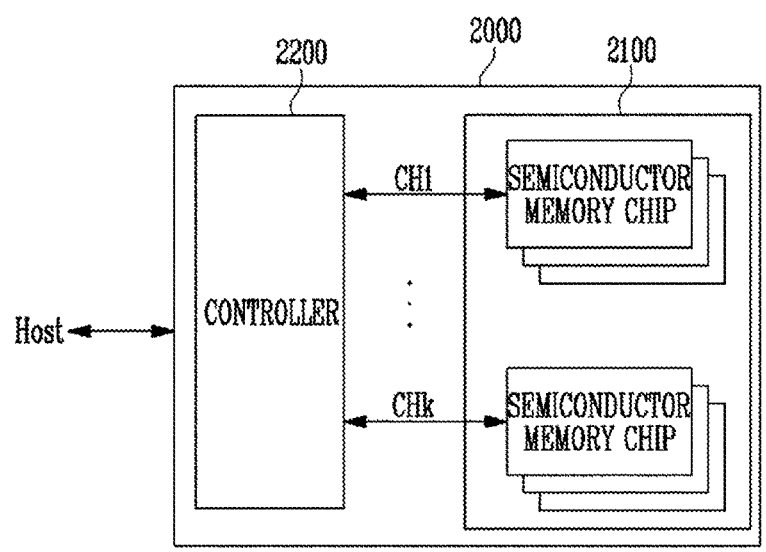
FIG. 16 is a block diagram illustrating an example of application of the memory system of FIG. 15.

FIG. 16 is a block diagram illustrating an example 2000 of application of the memory system of FIG. 15.

Referring to FIG. 16, the memory system 2000 includes a semiconductor memory device 2100 and a controller 2200. The semiconductor memory device 2100 includes a plurality of semiconductor memory chips. The semiconductor memory chips are divided into a plurality of groups.

Referring to FIG. 16, it is illustrated that each of the plurality of groups communicates with the controller 2200 through first to k-th channels CH1 to CHk. Each semiconductor memory chip may have the same configuration and operation as those of an embodiment of the semiconductor memory device 1300 described with reference to FIG. 15.

Each group communicates with the controller 2200 through one common channel. The controller 2200 has the same configuration as that of the controller 1200 described with reference to FIG. 15 and is configured to control the plurality of memory chips of the semiconductor memory device 2100 through the plurality of channels CH1 to CHk.

Referring to FIG. 16, a description has been made such that a plurality of semiconductor memory chips are coupled to a single channel. However, it will be understood that the memory system 2000 may be modified such that a single semiconductor memory chip is coupled to a single channel.

Figure 17:
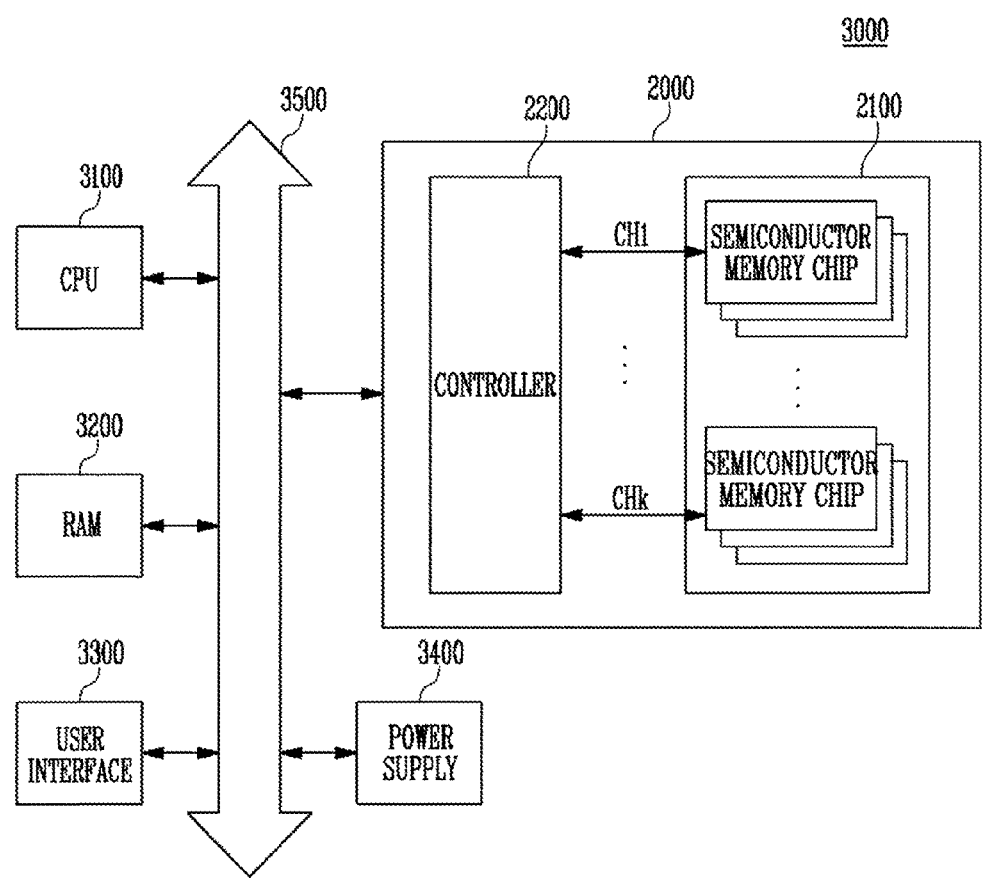
FIG. 17 is a block diagram illustrating a computing system including the memory system described with reference to FIG. 16.

FIG. 17 is a block diagram illustrating a computing system including the memory system described with reference to FIG. 16.

Referring to FIG. 17, a computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 17, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 17, the memory system 2000 described with reference to FIG. 16 is illustrated as being provided. However, the memory system 2000 may be replaced with the memory system 1000 described with reference to FIG. 15. In an embodiment, the computing system 3000 may be configured to include all of the memory systems 1000 and 2000 described with reference to FIGS. 15 and 16.

In accordance with the embodiments of the present disclosure, there may be provided a semiconductor memory device which may have improved reliability, and a method of operating the semiconductor memory device.

Although the examples of embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may be not always performed in regular order. Furthermore, the embodiments disclosed in the present specification and the drawings just aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array including a plurality of memory blocks, each including dummy cells coupled to dummy word lines and normal memory cells coupled to normal word lines;
a peripheral circuit configured to perform an erase operation on a memory block selected from among the plurality of memory blocks; and
control logic configured to control the peripheral circuit so that, during the erase operation, a pre-program voltage pulse is applied both to the dummy word lines and to the normal word lines, and dummy word line voltages to be applied to the dummy word lines are respectively controlled depending on program speeds of the dummy cells while an erase voltage is applied to a common source line of the selected memory block.

2. The semiconductor memory device according to claim 1, wherein the control logic is configured to apply an erase permission voltage to the dummy word lines and to the normal word lines while the erase voltage is applied to the common source line, and then respectively apply an erase prohibition voltage to the dummy word lines at different timings depending on the program speeds of the dummy cells.

3. The semiconductor memory device according to claim 2, wherein the erase permission voltage is a ground voltage.

4. The semiconductor memory device according to claim 2, wherein the control logic comprises an erase operation control unit configured to store information about timings at which the erase prohibition voltage is applied to the dummy word lines depending on differences between the program speeds of the dummy cells.

5. The semiconductor memory device according to claim 2,
wherein the control logic is configured to apply the erase permission voltage to a first dummy word line coupled to a first dummy cell, among the dummy cells, and then apply the erase prohibition voltage to the first dummy word line if a first reference time has elapsed since the application of the erase permission voltage, and is configured to apply the erase permission voltage to a second dummy word line coupled to a second dummy cell, among the dummy cells, and then apply the erase prohibition voltage to the second dummy word line if a second reference time longer than the first reference time has elapsed since the application of the erase permission voltage,
wherein a program speed of the first dummy cell is higher than a program speed of the second dummy cell.

6. The semiconductor memory device according to claim 1, wherein the control logic is configured to respectively apply erase permission voltages having different levels to the dummy word lines, and then apply the erase prohibition voltage to the dummy word lines if a reference time has elapsed since the application of the erase permission voltages.

7. The semiconductor memory device according to claim 6, wherein the control logic is configured to apply a ground voltage to the normal word lines while respectively applying the erase permission voltages having different levels to the dummy word lines.

8. The semiconductor memory device according to claim 6, wherein the control logic is configured to:
apply a first erase permission voltage to a first dummy word line coupled to a first dummy cell, among the dummy cells, and apply a second erase permission voltage having a voltage level lower than that of the first erase permission voltage to a second dummy word line coupled to a second dummy cell, among the dummy cells,
wherein a program speed of the first dummy cell is higher than the program speed of the second dummy cell.

9. The semiconductor memory device according to claim 8,
wherein the first erase permission voltage has a positive voltage level that is higher than 0 V and is lower than the erase prohibition voltage, and
wherein the second erase permission voltage has a negative voltage level that is lower than 0V.

10. The semiconductor memory device according to claim 1,
wherein the control logic is configured to respectively apply erase permission voltages having different levels to the dummy word lines, and then respectively apply an erase prohibition voltage to the dummy word lines at different timings depending on the program speeds of the dummy cells.

11. A method of operating a semiconductor memory device, the semiconductor memory device including a plurality of memory blocks, each including dummy cells coupled to dummy word lines and normal memory cells coupled to normal word lines, the method comprising:
applying a pre-program voltage pulse both to dummy word lines and to normal word lines that are coupled to a memory block selected from among the plurality of memory blocks; and
respectively controlling dummy word line voltages to be applied to the dummy word lines depending on program speeds of the dummy cells while an erase voltage is applied to a common source line of the selected memory block.

12. The method according to claim 11, wherein the respectively controlling the dummy word line voltages comprises:
applying an erase permission voltage to the dummy word lines and the normal word lines; and
respectively applying an erase prohibition voltage to the dummy word lines at different timings depending on program speeds of the dummy cells.

13. The method according to claim 12, wherein the applying the erase permission voltage is configured to apply a ground voltage to the dummy word lines and the normal word lines.

14. The method according to claim 12, wherein the respectively applying the erase prohibition voltage to the dummy word lines comprises:
if a first reference time has elapsed since application of the erase permission voltage to a first dummy word line coupled to a first dummy cell, among the dummy cells, applying the erase prohibition voltage to the first dummy word line; and
if a second reference time longer than the first reference time has elapsed since application of the erase permission voltage to a second dummy word line coupled to a second dummy cell, among the dummy cells, applying the erase prohibition voltage to the second dummy word line,
wherein a program speed of the first dummy cell is higher than a program speed of the second dummy cell.

15. The method according to claim 12, wherein the respectively controlling the dummy word line voltages comprises:

respectively applying erase permission voltages having different levels to the dummy word lines; and
if a reference time has elapsed since the application of the erase permission voltages having different levels to the dummy word lines, applying an erase prohibition voltage to the dummy word lines.

16. The method according to claim 15, further comprising applying a ground voltage to the normal word lines while respectively applying the erase permission voltages having different levels to the dummy word lines.

17. The method according to claim 15, wherein the respectively applying the erase permission voltages having different levels comprises:
applying a first erase permission voltage to a first dummy word line coupled to a first dummy cell, among the dummy cells; and
applying a second erase permission voltage having a voltage level lower than that of the first erase permission voltage to a second dummy word line coupled to a second dummy cell, among the dummy cells,
wherein a program speed of the first dummy cell is higher than a program speed of the second dummy cell.

18. The method according to claim 17,
wherein the first erase permission voltage has a positive voltage level that is higher than 0 V and is lower than the erase prohibition voltage, and
wherein the second erase permission voltage has a negative voltage level that is lower than 0 V.

19. The method according to claim 11, wherein the respectively controlling the dummy word line voltages comprises:
respectively applying erase permission voltages having different levels to the dummy word lines; and
respectively applying an erase prohibition voltage to the dummy word lines at different timings depending on program speeds of the dummy cells.

20. A semiconductor memory device, comprising:
a memory cell array including a plurality of memory blocks, each including dummy cells coupled to dummy word lines and normal memory cells coupled to normal word lines;
a peripheral circuit configured to perform an erase operation on a memory block selected from among the plurality of memory blocks; and
control logic configured to control the peripheral circuit so that, during the erase operation, a pre-program voltage pulse is applied to the dummy word lines, and dummy word line voltages to be applied to the dummy word lines are respectively controlled while an erase voltage is applied to a common source line of the selected memory block.

* * * * *